United States Patent
Okada

(10) Patent No.: US 7,362,643 B2
(45) Date of Patent: Apr. 22, 2008

(54) SEMICONDUCTOR-MEMORY DEVICE AND BANK REFRESH METHOD

(75) Inventor: Kazuyuki Okada, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/496,578

(22) Filed: Aug. 1, 2006

(65) Prior Publication Data

US 2007/0047361 A1 Mar. 1, 2007

(30) Foreign Application Priority Data

Aug. 30, 2005 (JP) .............................. 2005-249496

(51) Int. Cl.
*G11C 7/00* (2006.01)
*G11C 8/00* (2006.01)

(52) U.S. Cl. ............ 365/222; 365/230.03; 365/189.05; 365/194; 365/203; 365/233

(58) Field of Classification Search ................ 365/222, 365/230.03, 189.05, 194, 203, 233
See application file for complete search history.

(56) References Cited

U.S. PATENT DOCUMENTS

| | | | | |
|---|---|---|---|---|
| 4,601,018 A | * | 7/1986 | Baum et al. ................. | 365/222 |
| 4,967,397 A | * | 10/1990 | Walck ......................... | 365/222 |
| 5,590,086 A | * | 12/1996 | Park et al. .............. | 365/230.03 |
| 5,793,694 A | | 8/1998 | Akiba et al. | |
| 5,796,669 A | * | 8/1998 | Araki et al. ................. | 365/222 |
| 5,873,114 A | * | 2/1999 | Rahman et al. ............. | 365/222 |
| 5,907,857 A | * | 5/1999 | Biswas ....................... | 365/222 |
| 6,381,188 B1 | | 4/2002 | Choi et al. | |
| 6,438,063 B1 | * | 8/2002 | Lee ........................ | 365/230.03 |
| 6,529,433 B2 | | 3/2003 | Choi | |
| 6,590,822 B2 | | 7/2003 | Hwang et al. | |
| 6,611,470 B2 | * | 8/2003 | Hidaka ....................... | 365/222 |
| 6,819,617 B2 | | 11/2004 | Hwang et al. | |
| 6,992,943 B2 | | 1/2006 | Hwang et al. | |
| 7,145,828 B2 | * | 12/2006 | Lee et al. ................... | 365/222 |

FOREIGN PATENT DOCUMENTS

| | | |
|---|---|---|
| JP | 09-204774 | 8/1997 |
| JP | 2000-215665 A | 8/2000 |
| JP | 2001-101067 A | 4/2001 |
| JP | 2002-334576 A | 11/2002 |
| JP | 2002-358789 A | 12/2002 |

* cited by examiner

*Primary Examiner*—Trong Phan
(74) *Attorney, Agent, or Firm*—Foley & Lardner LLP

(57) ABSTRACT

A semiconductor memory device has a plurality of banks in which operations are performed for the banks in accordance with a command supplied from an external controller. The semiconductor memory device comprises a latch circuit for latching a bank selection signal indicative of a bank which was precharged last among the banks before execution of an auto refresh command for sequentially refreshing the banks, and a refresh control circuit, responsive to the execution of the auto refresh command, for controlling the order in which the banks are refreshed according to the auto refresh command such that a bank which is selected by the latched selection signal is refreshed last among the banks.

3 Claims, 6 Drawing Sheets

Fig. 5

| Last PRE | AutoREF |
|---|---|
| | 1stREF, 2ndREF, 3rdREF, 4thREF |
| PREA | REFB⇒REFC⇒REFD⇒REFA |
| PREB | REFC⇒REFD⇒REFA⇒REFB |
| PREC | REFD⇒REFA⇒REFB⇒REFC |
| PRED | REFA⇒REFB⇒REFC⇒REFD |

150
SEMICONDUCTOR-MEMORY DEVICE AND BANK REFRESH METHOD

BACKGROUND OF THE INVENTION (1) Field of the Invention

The present invention relates to a semiconductor memory device such as DRAM (Dynamic Random Access Memory), and more particularly, to a semiconductor memory device which comprises a plurality of banks, as represented by SDRAM (Synchronous DRAM).

(2) Description of the Related Art

DRAM is comprised of a plurality of memory cells, each made up of a capacitor and a transistor, arranged in a matrix form, where a charge is accumulated on the capacitor of each cell to store information. In this DRAM, since the charge accumulated on the capacitor decreases over time, a refresh (re-write) is performed every fixed time for holding the stored information.

SDRAM, in which a memory chip is divided into a plurality of banks and in which memory cells can be independently driven in each bank, is known as one kind of DRAM's. In this SDRAM, a memory cell operation is executed on a bank-by-bank basis in accordance with a command supplied from an external controller (see JP-A-2000-215665).

Several commands are used in the SDRAM, one of which is an auto refresh command. As the auto refresh command is executed in the SDRAM, each bank is sequentially refreshed. Before executing the auto refresh command, each bank is precharged by an all bank precharge command or the like.

The refresh of each bank by the auto refresh command is generally executed in a predetermined order without regard to the order in which each bank was precharged before the execution of the auto refresh command. FIG. 1 illustrates a conventional refresh control circuit used in SDRAM which has four banks A, B, C, D.

The refresh control circuit illustrated in FIG. 1 has delay circuits 100-102 which are connected in series, and the refresh control circuit receives the timing signal "REF" indicative of the timing at which the auto refresh command is executed. The refresh control circuit sequentially generates refresh bank selection signals "REFA," "REFB," "REFC," "REFD" at a timing at which the timing signal "REF" becomes active. The sequence of the transmission of the refresh bank selection signals is fixed. Thus, irrespective of which of banks A-D is precharged last, the refresh operation is performed in the order of banks A, B, C, D. Therefore, if bank A is precharged last (by way of signal "PREA"), followed by the execution of the auto refresh command, bank A is refreshed immediately after bank A was precharged, as illustrated in FIG. 2 (whereby bank A is selected by active command signal A, denoted by "ACTA" in FIG. 2). In this event, the internal tRP (RAS Precharge Time) of bank A becomes shorter, as compared with the other banks, causing difficulties in providing stable information storage operations.

SUMMARY OF THE INVENTION

It is an object of the present invention to provide a semiconductor memory device and a bank refresh method which are capable of solving the problem mentioned above, and of ensuring a sufficient internal tRP.

To achieve the above object, the present invention provides a semiconductor memory device which has a plurality of banks, in which operations are performed for the plurality of banks in accordance with a command supplied from an external controller. The semiconductor memory device includes a latch circuit for latching a bank selection signal indicative of a bank which was precharged last among the plurality of banks before execution of an auto refresh command for sequentially refreshing the plurality of banks; and a refresh control circuit, responsive to the execution of the auto refresh command, for controlling an order in which the plurality of banks are refreshed according to the auto refresh command such that a bank which is selected by the latched selection signal is refreshed last among the plurality of banks. According to this configuration, since a bank, which was precharged last among the banks, is always refreshed last among the banks, the internal tRP can be ensured.

According to the present invention, since a sufficient internal tRP can be ensured, the semiconductor memory device can provide stable information write/read operations.

The above and other objects, features, and advantages of the present invention will become apparent from the following description with reference to the accompanying drawings which illustrate examples of the present invention.

BRIEF DESCRIPTION OF THE DRAWINGS

In the accompanying drawings:

FIG. 5 is a diagram for describing the operation of the refresh control unit illustrated in FIG. 4 for generating a refresh bank selection signal;

DETAILED DESCRIPTION OF THE PREFERRED EMBODIMENT(S)

Figure 1:
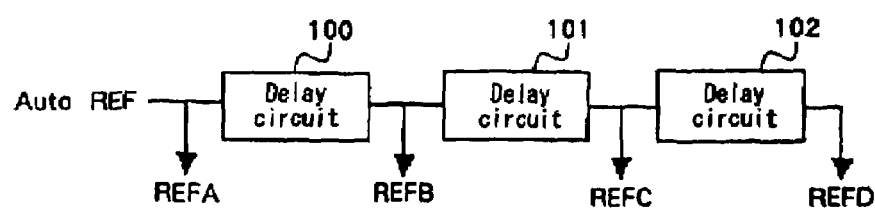
FIG. 1 is a block diagram illustrating a conventional refresh control circuit used in SDRAM which has four banks A, B, C, D.
Figure 2:
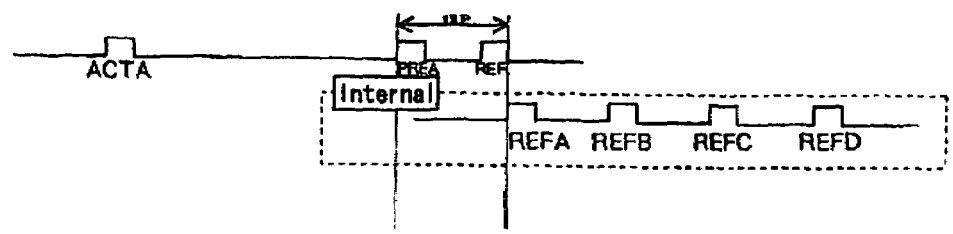
FIG. 2 is a timing chart for describing the operation of the refresh control circuit illustrated in FIG. 1.
Figure 3:
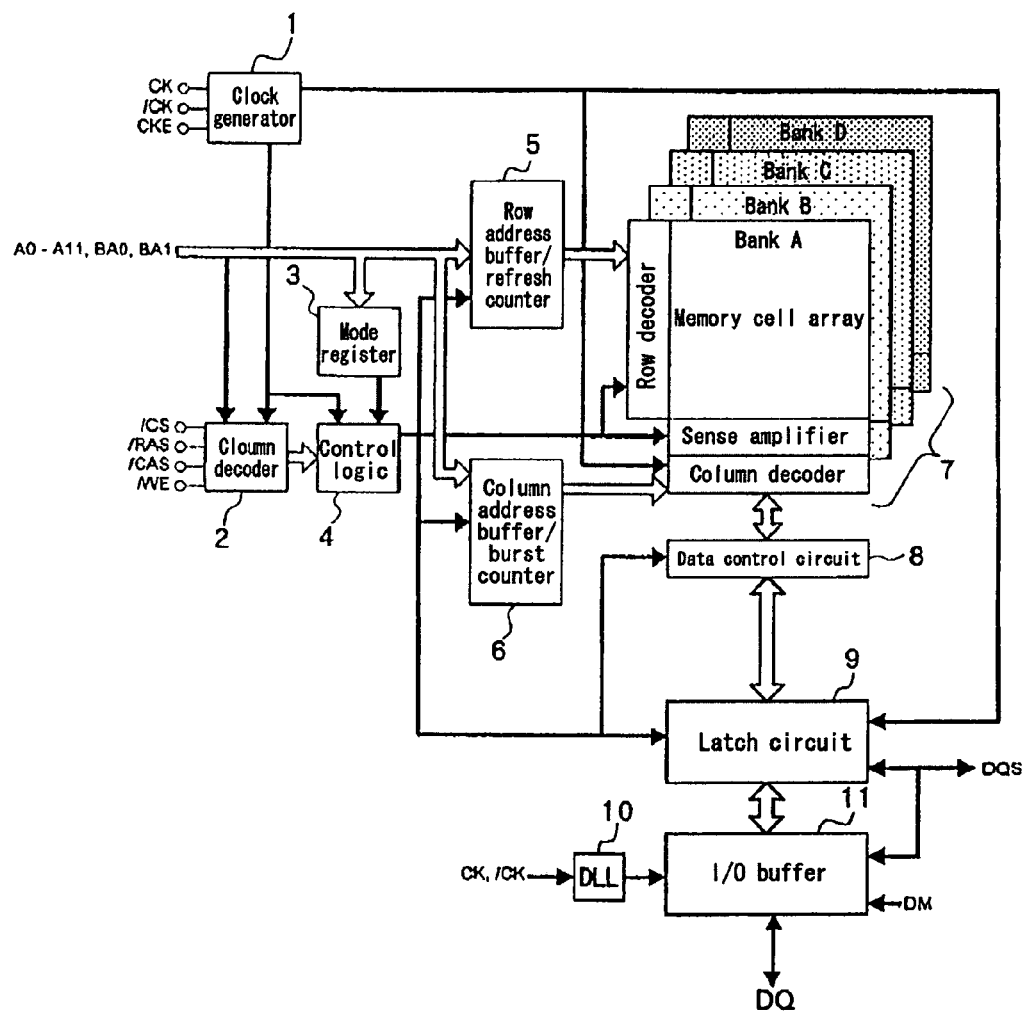
FIG. 3 is a block diagram generally illustrating the configuration of SDRAM to which the present invention is applied.

FIG. 3 generally illustrates the configuration of SDRAM according to one embodiment of the present invention. Referring to FIG. 3, the SDRAM comprises clock generator 1, column decoder 2, mode register 3, control logic 4, row address buffer/refresh counter 5, column address buffer/burst counter 6, memory unit 7, data control logic 8, latch circuit 9, DLL (Delay Locked Loop) 10, and I/O buffer 11.

Clock generator 1 receives clock signals CK, /CK and clock enable signal CKE to generate a reference clock signal based on these signals. The clock from clock generator 1 is supplied to column decoder 2 and control logic 4, and is also supplied to memory unit 7, data control logic 8, and latch circuit 9. Here, clock signal /CK has the same period as clock signal CK, but clock signal /CK has a phase reverse to clock signal CK. Clock enable signal CKE is a signal for determining whether clock signal CK is valid or invalid.

Column decoder 2 receives chip select signal /CS, row address strobe signal /RAS, column address strobe signal /CAS, write enable signal /WE, and bank address signals BA0, BA1 to fetch a command or an address based on these signals. A command is specified by a combination of logic levels of respective signals (CK, /CK, CKE, /CS, /RAS, /CAS, /WE). Commands include an active command for selecting a bank, a read command for reading data from a bank, a precharge command for precharging a bank, an auto refresh command for refreshing a bank, and the like.

Mode register 3 receives address signals A0-A11 to set an operation mode with a latency, a burst length, a burst sequence and the like based on these signals. Row address buffer/refresh counter 5 receives address signals A0-A11 and bank address signals BA0, BA1 to generate a row address based on these signals. Column address buffer/burst counter 6 receives address signals A0-A11 and bank address signals BA0, BA1 to generate a column address based on these signals. The generated row address and column address are supplied to a row decoder and a column decoder in each of banks A-D, respectively, in memory unit 7.

Control logic 4 generates control signals for controlling respective operations of row address buffer/refresh counter 5, column address buffer/burst counter 6, row decoder and sense amplifier of each bank A-D in memory unit 7, data control logic 8, and latch circuit 9 based on an operation mode set in mode register 3, and a command and an address fetched by column decoder 2.

Data control logic 8 is a circuit that controls writing data into and read data from each bank A-D in memory unit 7. Latch circuit 9 latches a control signal from control logic 4 based on the clock signal from clock generator 1, and receives/sends data through data control logic 8 in synchronization with the clock signal.

DLL 10 is provided for adjusting and controlling a time difference which occurs between an external clock and an internal clock. DLL 10 is controlled so that skew that develops between data signals (including data input/output DQ and data strobe signal DQS) and clock signals CK, /CK reaches to minimum. I/O buffer 11 is a data input/output buffer that receives data strobe signal DQS and data mask signal DM).

In the SDRAM described above, each signal (CK, /CK, CKE, /CS, /RAS, /CAS, /WE, BA0, BA1, A0-A11) is supplied from a controller, not shown, a bank and a row address are specified by row address buffer/refresh counter 5, and a column address is specified by column address buffer/burst counter 6. Then, operations corresponding to writing data or reading data or a specified command are executed in accordance with the specified bank, row address, and column address. The respective banks are refreshed by executing the auto refresh command. Before the execution of the auto refresh command, a precharge command (all bank precharge command) is always executed to precharge each bank.

In the SDRAM of this embodiment, a refresh control unit is incorporated in row address buffer/refresh counter 5 for controlling the order in which the banks are refreshed based on the order of the precharge which has been executed before the refresh.

Figure 4:
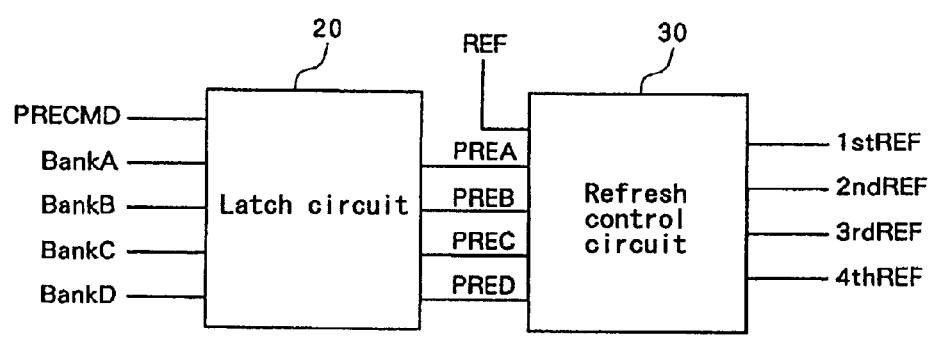
FIG. 4 is a block diagram illustrating the configuration of a refresh control unit for the SDRAM, according to one embodiment of the present invention.

FIG. 4 illustrates the configuration of the refresh control unit. Referring to FIG. 4, the refresh control unit comprises latch circuit 20 and refresh control circuit 30. Latch circuit 20 receives a PRECMD signal that indicates the timing at which a precharge command is executed and precharge bank selection signals ("Bank A," "Bank B," "Bank C," "Bank D" in FIG. 4) that indicate a bank which was precharged. Latch circuit 20 latches and delivers a bank selection signal that indicates a bank which was precharged last ("PREA," "PREB," "PREC," "PRED" in FIG. 4). The precharge bank selection signal is a control signal supplied from control logic 4 upon execution of a precharge command, and corresponds, for example, to an active command for specifying a bank.

Refresh control circuit 30 receives a REF signal that indicates the timing at which an auto refresh command is executed and a latch signal from latch circuit 20 to generate refresh bank selection signals ("1stREF," "2ndREF," "3rdRef," "4thREF" in FIG. 4) for controlling the order in which the banks are refreshed, based on these input signals.

FIG. 5 is a diagram for describing operations of the refresh control unit for generating the refresh bank selection signal. When bank A is precharged last, latch signal "PREA" is supplied from latch circuit 20 to refresh control circuit 30. When the auto refresh command is executed to cause the REF signal to become active, refresh control circuit 30 sequentially generates signals "REFB," "REFC," "REFD," "REFA" as refresh bank selection signals "1stREF," "2ndREF," "3rdREF," "4thREF." Based on these signals, the refresh is executed in the order of bank B, bank C, bank D, and bank A in memory unit 7.

When bank B is precharged last, latch signal "PREB" is supplied from latch circuit 20 to refresh control circuit 30. When the auto refresh command is executed to cause the REF signal to become active, refresh control circuit 30 sequentially generates "REFC," "REFD," "REFA", "REFB" as refresh bank selection signals "1stREF," "2ndREF,", "3rdREF," "4thREF." Based on these signals, the refresh is executed in the order of bank C, bank D, bank A, and bank B in memory unit 7.

When bank C is precharged last, latch signal "PREC" is supplied from latch circuit 20 to refresh control circuit 30. When the auto refresh command is executed to cause the REF signal to become active, refresh control circuit 30 sequentially generates signals "REFD," "REFA," "REFB," "REFC" as refresh bank selection signals "1stREF," "2ndREF," "3rdREF," "4thREF." Based on these signals, the refresh is executed in the order of bank D, bank A, bank B, and bank C in memory unit 7.

When bank D is precharged last, latch signal "PRED" is supplied from latch circuit 20 to refresh control circuit 30. When the auto refresh command is executed to cause the REF signal to become active, refresh control circuit 30 sequentially generates signals "REFA," "REFB," "REFC," "REFD" as refresh bank selection signals "1stREF," "2ndREF," "3rdREF," "4thREF." With these signals, the refresh is executed in the order of bank A, bank B, bank C, and bank D in memory unit 7.

Figure 6:
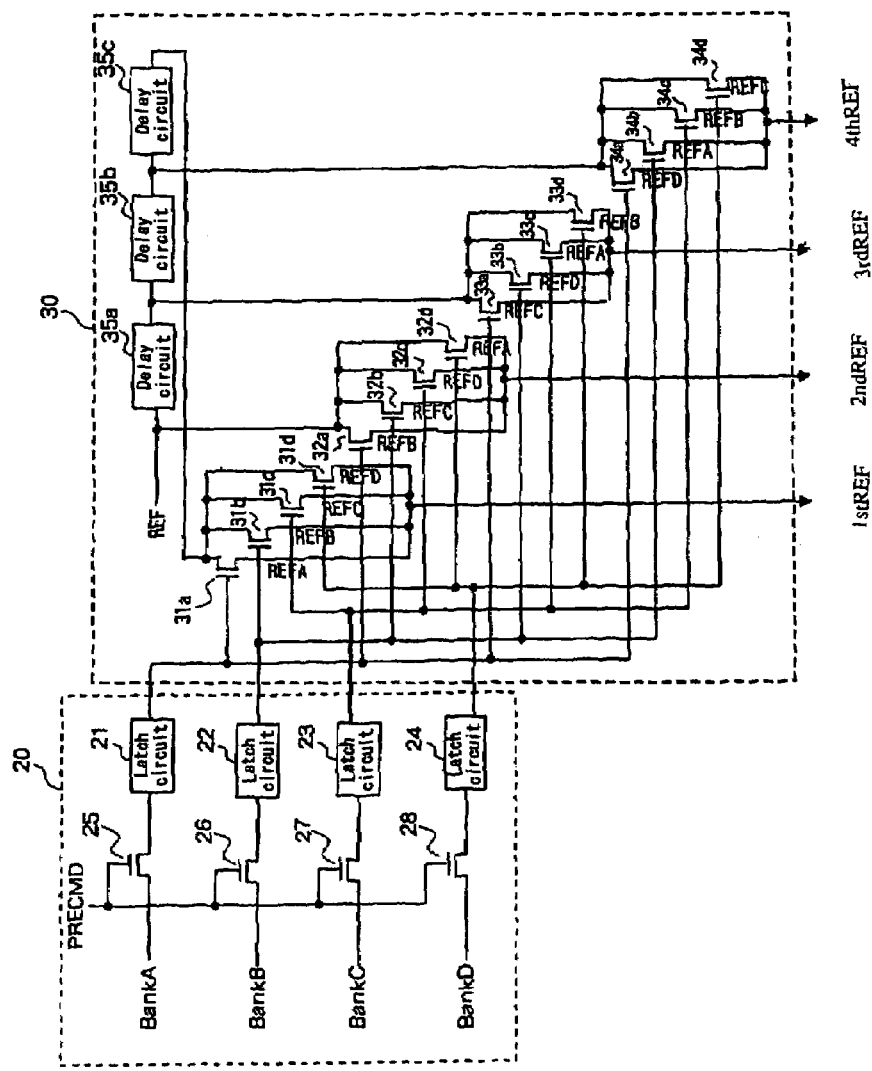
FIG. 6 is a circuit diagram illustrating a specific configuration of a latch circuit and a refresh control circuit of the refresh control unit illustrated in FIG. 4.

FIG. 6 is a circuit diagram illustrating a specific configuration of latch circuit 20 and refresh control circuit 30. Referring to FIG. 6, latch circuit 20 comprises latch circuit 21 which receives precharge bank selection signal "Bank A" through switch 25, latch circuit 22 which receives precharge bank selection signal "Bank B" through switch 26, latch circuit 23 which receives precharge bank selection signal "Bank C" through switch 27, and latch circuit 24 which receives precharge bank selection signal "Bank D" through switch 28. Switches 25-28 are controlled to turn on or off based on a PRECMD signal.

Refresh control circuit 30 comprises a first through to a fourth selector circuit for delivering refresh bank selection signals based on the outputs (latch signals) of latch circuits 21-24 and a delay unit which receives the REF signal. The delay unit is composed of delay circuits 35a-35c connected in series.

The first selector circuit comprises switch 31a controlled to turn on/off by the output (latch signal "PREA") of latch circuit 21, switch 31b controlled to turn on/off by the output (latch signal "PREB") of latch circuit 22, switch 31c controlled to turn on/off by the output (latch signal "PREC") of latch circuit 23, and switch 31d controlled to turn on/off by the output (latch signal "PRED") of latch circuit 24. Each switch 31a-31d has a terminal to which the REF signal is supplied through delay circuits 35a-35c. Switch 31a delivers bank selection signal "REFA" when the REF signal becomes active while switch 31a is in the on-state. Switch 31b delivers bank selection signal "REFB" when the REF signal becomes active while switch 31b is in the on-state. Switch 31c delivers bank selection signal "REFC" when the REF signal becomes active while switch 31c is in the on-state. Switch 31d delivers bank selection signal "REFD" when the REF signal becomes active while switch 31d is in the on-state.

The second selector circuit comprises switch 32a controlled to turn of/off by the output (latch signal "PREA") of latch circuit 21, switch 32b controlled to turn on/off by the output (latch signal "PREB") of latch circuit 22, switch 32c controlled to turn on/off by the output (latch signal "PREC") of latch circuit 23, and switch 32d controlled to turn on/off by the output (latch signal "PRED") of latch circuit 24. Each switch 32a-32d has a terminal to which the REF signal is directly supplied. Switch 32a delivers bank selection signal "REFB" when the REF signal becomes active while switch 32a is in the on-state. Switch 32b delivers bank selection signal "REFC" when the REF signal becomes active while switch 32b is in the on-state. Switch 32c delivers bank selection signal "REFD" when the REF signal becomes active while switch 32c is in the on-state. Switch 32d delivers bank selection signal "REFA" when the REF signal becomes active while switch 32d is in the on-state.

The third selector circuit comprises switch 33a controlled to turn of/off by the output (latch signal "PREA") of latch circuit 21, switch 33b controlled to turn on/off by the output (latch signal "PREB") of latch circuit 22, switch 33c controlled to turn on/off by the output (latch signal "PREC") of latch circuit 23, and switch 33d controlled to turn on/off by the output (latch signal "PRED") of latch circuit 24. Each switch 33a-33d has a terminal to which the REF signal is supplied through delay circuit 35a. Switch 33a delivers bank selection signal "REFC" when the REF signal becomes active while switch 33a is in the on-state. Switch 31b delivers bank selection signal "REFD" when the REF signal becomes active while switch 33b is in the on-state. Switch 33c delivers bank selection signal "REFA" when the REF signal becomes active while switch 33c is in the on-state. Switch 33d delivers bank selection signal "REFB" when the REF signal becomes active while switch 33d is in the on-state.

The fourth selector circuit comprises switch 34a controlled to turn of/off by the output (latch signal "PREA") of latch circuit 21, switch 34b controlled to turn on/off by the output (latch signal "PREB") of latch circuit 22, switch 34c controlled to turn on/off by the output (latch signal "PREC") of latch circuit 23, and switch 34d controlled to turn on/off by the output (latch signal "PRED") of latch circuit 24. Each switch 34a-34d has a terminal to which the REF signal is supplied through delay circuits 35a, 35b. Switch 34a delivers bank selection signal "REFD" when the REF signal becomes active while switch 34a is in the on-state. Switch 31b delivers bank selection signal "REFA" when the REF signal becomes active while switch 34b is in the on-state. Switch 34c delivers bank selection signal "REFB" when the REF signal becomes active while switch 34c is in the on-state. Switch 34d delivers bank selection signal "REFC" when the REF signal becomes active while switch 34d is in the on-state.

In the refresh control unit described above, all switches 25-28 turn on at a timing at which the PRECMD signal becomes active. The PRECMD signal indicates the timing at which the precharge command (here, all bank precharge command) is executed.

When bank A is precharged last, bank selection signal "Bank A" is latched in latch circuit 21, causing latch signal "PREA," which is the output of latch circuit 21, to go to a high level. As the output of latch circuit 21 goes to a high level, switch 31a of the first selector circuit, switch 32a of the second selector circuit, switch 33a of the third selector circuit, and switch 34a of the fourth selector circuit turn on, respectively. When switches 31a, 32a, 33a, 34a turn on, they deliver "REFA," "REFB," "REFC," "REFD," which are the refresh bank selection signals at a timing at which the REF signal becomes active. In this event, since the REF signal becomes active in the order of switch 32a, switch 33a, switch 34a, and switch 31a, signals "REFB," "REFC," "REFD," "REFA" are delivered as refresh bank selection signals "1stREF," "2ndREF," "3rdREF," "REFD" in sequence.

When bank B is precharged last, bank selection signal "Bank B" is latched in latch circuit 22, causing latch signal "PREB," which is the output of latch circuit 22, to go to a high level. As the output of latch circuit 22 goes to a high level, switch 31b of the first selector circuit, switch 32b of the second selector circuit, switch 33b of the third selector circuit, and switch 34b of the fourth selector circuit turn on, respectively. When switches 31b, 32b, 33b, 34b turn on, they deliver "REFB," "REFC," "REFD," "REFA," which are the refresh bank selection signals at a timing at which the REF signal becomes active. In this event, since the REF signal becomes active in the order of switch 32b, switch 33b, switch 34b, and switch 31a, signals "REFC," "REFD," "REFA," "REFB" are delivered as refresh bank selection signals "1stREF," "2ndREF," "3rdREF," "REFD" in sequence.

When bank C is precharged last, bank selection signal "Bank C" is latched in latch circuit 23, causing latch signal "PREC," which is the output of latch circuit 23, to go to a high level. As the output of latch circuit 23 goes to a high level, switch 31c of the first selector circuit, switch 32c of the second selector circuit, switch 33c of the third selector circuit, and switch 34c of the fourth selector circuit turn on, respectively. When switches 31c, 32c, 33c, 34c turn on, they deliver "REFC," "REFD," "REFA," "REFB," which are the refresh bank selection signals at a timing at which the REF signal becomes active. In this event, since the REF signal becomes active in the order of switch 32c, switch 33c, switch 34c, and switch 31c, signals "REFD," "REFA," "REFB," "REFC" are delivered as refresh bank selection signals "1stREF," "2ndREF," "3rdREF," "REFD" in sequence.

When bank D is precharged last, bank selection signal "Bank D" is latched in latch circuit 24, causing latch signal "PRED," which is the output of latch circuit 24, to go to a high level. As the output of latch circuit 24 goes to a high level, switch 31d of the first selector circuit, switch 32d of the second selector circuit, switch 33d of the third selector circuit, and switch 34d of the fourth selector circuit turn on, respectively. When switches 31d, 32d, 33d, 34d turn on, they deliver "REFD," "REFA," "REFB," "REFC," which are the refresh bank selection signals at a timing at which the REF signal becomes active. In this event, since the REF signal becomes active in the order of switch 32d, switch 33d, switch 34d, and switch 31d, signals "REFA," "REFB," "REFC," "REFD" are delivered as refresh bank selection signals "1stREF," "2ndREF," "3rdREF," "REFD" in sequence.

Figure 7:
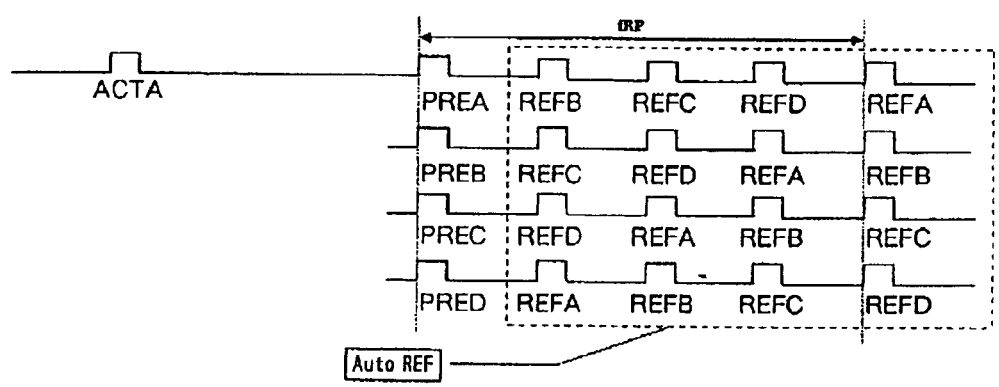
FIG. 7 is a timing chart for describing the operation of the refresh control unit illustrated in FIG. 6.

FIG. 7 is a timing chart for describing the operation of the refresh control unit illustrated in FIG. 6. When bank A was selected by active command A (signal "ACTA"), and when bank A was a bank refreshed last by signal "PREA" among banks A to D, bank B, bank C, bank D, and bank A are refreshed in this order by bank selection signals "REFB," "REFC," "REFD," REFA." This refresh operation by bank selection signals "REFB," "REFC," "REFD," REFA" is a refresh operation executed by the auto refresh command. In this event, the internal tRP for bank A which is precharged last is provided based on a time from a leading edge of "PREA" to the next leading edge of "REFA." In this way, a sufficient time can be ensured for the internal tRP to enable a stable operation for bank A.

When bank B was precharged last by signal "PREB" among banks A to D, bank C, bank D, bank A, and bank B are refreshed in this order by bank selection signals "REFC," "REFD," "REFA," "REFB." In this event, the internal tRP for bank B which is precharged last is provided based on a time from a leading edge of "PREB" to the next leading edge of "REFB." In this way, a sufficient internal tRP can be ensured to enable a stable operation for bank B as well.

When bank C was precharged last by signal "PREC" among banks A to D, bank D, bank A, bank B, bank C are refreshed in this order by bank selection signals "REFD," "REFA," "REFB," "REFC." In this event, the internal tRP for bank C which is precharged last is provided based on a time from a leading edge of "PREC" to the next leading edge of "REFC." In this way, a sufficient internal tRP can be ensured to enable a stable operation for bank C as well.

When bank D was precharged last by signal "PRED" among banks A to D, bank A, bank B, bank C, and bank D are refreshed in this order by bank selection signals "REFA," "REFB," "REFC," and "REFD." In this event, the internal tRP for bank D which is precharged last is provided on a time from a leading edge of "PRED" to the next leading edge of "REFD." In this way, a sufficient internal trp can be ensured to enable a stable operation for bank D as well.

The state of the latch in latch circuit 20 is released after the auto refresh has been completed.

As described above, in the SDRAM of this embodiment, upon execution of the auto refresh, the refresh operation for the last precharged bank is performed last without fail, thus making it possible to ensure a sufficient internal tRP and provide a stable storage operation.

As will be understood, the SDRAM of the embodiment described above is an example of the present invention, and can be modified as appropriate in its configuration and operation. For example, the number of banks is not limited to four, but a plurality of banks may be provided.

Also, the present invention is not limited to the SDRAM, but can be applied to any other semiconductor memory device which comprises a plurality of banks.

While preferred embodiments of the present invention have been described using specific terms, such description is for illustrates purposes only, and it is to be understood that changes and variations may be made without departing from the spirit or scope of the following claims.

What is claimed is:

1. A semiconductor memory device having a plurality of banks, in which operations are performed for said plurality of banks in accordance with a command supplied from an external controller, said semiconductor memory device comprising:

a latch circuit for latching a bank selection signal indicative of a bank which was precharged last among said plurality of banks before execution of an auto refresh command for sequentially refreshing said plurality of banks; and a refresh control circuit, responsive to the execution of the auto refresh command, for controlling an order in which said plurality of banks are refreshed according to the auto refresh command such that a bank, which is selected by the latched selection signal, is refreshed last among said plurality of banks.

2. The semiconductor memory device according to claim 1, wherein:

said plurality of banks include a first through to a fourth bank, said latch circuit includes:

a first latch circuit for latching a first bank selection signal by which said first bank is selected when said first bank was precharged last among said first to fourth banks;

a second latch circuit for latching a second bank selection signal by which said second bank is selected when said second bank was precharged last among said first to fourth banks;

a third latch circuit for latching a third bank selection signal by which said third bank is selected when said third bank was precharged last among said first to fourth banks; and a fourth latch circuit for latching a fourth bank selection signal by which said fourth bank is selected when said fourth bank was precharged last among said first to fourth banks, said refresh control circuit includes:

a delay unit, which has a first through to a third delay circuit which is connected in series, for receiving a timing signal indicative of a timing at which the auto refresh command is executed; and a first through to a fourth selector circuit, each having a first through to a fourth switch which is controlled to turn on/off by a latch signal from said first to fourth latch circuits, for generating a first through to a fourth refresh bank selection signal for selecting said first to fourth banks, wherein, said first selector is comprised such that each of said first to fourth switches has a terminal to which the timing signal is supplied through said first to third delay circuits, said first switch delivers the first refresh bank selection signal, said second switch delivers the second refresh bank selection signal, said third switch delivers the third refresh bank selection signal, and said fourth switch delivers the fourth refresh bank selection signal, said second selector circuit is comprised such that each of said first to fourth switches has a terminal to which the timing signal is directly supplied, said first switch delivers the second refresh bank selection signal, said second switch delivers the third refresh bank selection signal, said third switch delivers the fourth refresh bank selection signal, and said fourth switch delivers the first refresh bank selection signal, said third selector circuit is comprised such that each of said first to fourth switches has a terminal to which the timing signal is supplied through said first delay circuit, said first switch delivers the third refresh bank selection signal, said second switch delivers the fourth refresh bank selection signal, said third switch delivers the first refresh bank selection signal, and said fourth switch delivers the second refresh bank selection signal, and said fourth selector circuit is comprised such that each of said first to fourth switches has a terminal to which the timing signal is supplied through said first and second delay circuits, said first switch delivers the fourth refresh bank selection signal, said second switch delivers the first refresh bank selection signal, said third switch delivers the second refresh bank selection signal, and said fourth switch delivers the third refresh bank selection signal.

3. A bank refresh method performed in a semiconductor memory device having a plurality of banks in which operations are performed for said plurality of banks in accordance with a command supplied from an external controller, said method comprising:

a first step of latching a selection signal indicative of a bank which was precharged last among said plurality of banks before execution of an auto refresh command for sequentially refreshing said plurality of banks; and a second step of controlling an order in which said plurality of banks are refreshed by the auto refresh command such that a bank, which is selected by the selection signal latched at the first step, is refreshed last among said plurality of banks, upon execution of the auto refresh command.

* * * * *